United States Patent
Kim et al.

(10) Patent No.: US 7,626,454 B2
(45) Date of Patent: Dec. 1, 2009

(54) RADIO FREQUENCY SIGNAL AMPLIFYING DEVICE

(75) Inventors: Ki Joong Kim, Iksan (KR); Shinichi Iizuka, Suwon (KR); Youn Suk Kim, Daejeon (KR); Hyo Keun Bae, Sungnam (KR); Sang Hee Kim, Seoul (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 12/138,659

(22) Filed: Jun. 13, 2008

(65) Prior Publication Data

US 2008/0309411 A1 Dec. 18, 2008

(30) Foreign Application Priority Data

Jun. 13, 2007 (KR) ............... 10-2007-0057942

(51) Int. Cl.
H03F 3/68 (2006.01)
(52) U.S. Cl. ............... 330/124 R; 330/295; 330/301
(58) Field of Classification Search ............... 330/295, 330/124 R, 301, 252–261
See application file for complete search history.

(56) References Cited

U.S. PATENT DOCUMENTS 5,602,508 A 2/1997 Endou et al.
5,900,781 A 5/1999 Igarashi et al.
6,114,907 A 9/2000 Sakurai
6,670,848 B2 * 12/2003 Fanous et al. ........... 330/124 R

FOREIGN PATENT DOCUMENTS

| KR | 10-0157677 B | 12/1998 |
| KR | 10-0248886 B | 3/2000 |

OTHER PUBLICATIONS

Korean Intellectual Property Office, Office Action mailed May 29, 2008.

* cited by examiner

*Primary Examiner*—Robert Pascal
*Assistant Examiner*—Hieu P Nguyen
(74) *Attorney, Agent, or Firm*—Lowe Hauptman Ham & Berner

(57) ABSTRACT

There is provided a radio frequency (RF) signal amplifying device consuming less power and operable at a high voltage in a PA driving amplifying apparatus applicable to a PA amplifying circuit which amplifies power of an RF signal. The RF signal amplifying device includes: a balun converting an unbalanced radio frequency signal into a balanced radio frequency signal; a primary amplifier differentially amplifying the balanced radio frequency signal from the balun; and at least one secondary amplifier secondarily and differentially amplifying the balanced radio frequency signal amplified from the primary amplifier.

10 Claims, 5 Drawing Sheets

RADIO FREQUENCY SIGNAL AMPLIFYING DEVICE

CROSS-REFERENCE TO RELATED APPLICATIONS

This application claims the priority of Korean Patent Application No. 2007-57942 filed on Jun. 13, 2007, in the Korean Intellectual Property Office, the disclosure of which is incorporated herein by reference.

BACKGROUND OF THE INVENTION

1. Field of the Invention

The present invention relates to an amplifying device, and more particularly, to a radio frequency (RF) signal amplifying device consuming less power and operable at a high voltage in a power amplifier (PA) driving amplifying apparatus applicable to a PA amplifying circuit which amplifies power of an RF signal.

2. Description of the Related Art

Recently, development of wireless communication has also led to development of various wireless communication transceiver devices. Also, a radio frequency (RF) signal amplifier employed in these wireless communication transceiver devices has been under development.

A conventional RF signal amplifier will be described with reference to FIG. 1.

FIG. 1 is a circuit diagram illustrating the conventional RF signal amplifying device.

Referring to FIG. 1, the conventional amplifying device 10 includes an amplifying part 11 having a plurality of switches differentially switched on/off from one another and an inductor part 12 supplying a direct current (DC) to the amplifying part 11.

The aforesaid conventional amplifying device 10 includes inductors 12a and 12b supplying the DC, which add to the size of the amplifying device. Besides, the amplifying device 10 consumes a considerable amount of power due to resistance of the inductors thereby to be degraded in efficiency.

SUMMARY OF THE INVENTION

An aspect of the present invention provides a radio frequency (RF) signal amplifying device consuming less power and operable at a high voltage in a power amplifier (PA) driving amplifying apparatus applicable to a PA amplifying circuit which amplifies power of a signal.

According to an aspect of the present invention, there is provided an RF signal amplifying device including: a balun converting an unbalanced RF signal into a balanced RF signal; a primary amplifier differentially amplifying the balanced RF signal from the balun; and a secondary amplifying group including at least one secondary amplifier secondarily and differentially amplifying the balanced RF signal amplified from the primary amplifier, wherein the primary amplifier includes: a first amplifying unit disposed between a driving power terminal supplying a predetermined driving power and a ground, the first amplifying unit differentially amplifying the balanced RF signal and outputting a first balanced RF signal having a predetermined voltage level; a second amplifying unit connected in series between the driving power terminal and the first amplifying unit, and complementarily switched on/off with the first amplifying unit, the second amplifying unit differentially amplifying the balanced RF signal and outputting a second balanced RF signal having a voltage level higher than the voltage level of the first balanced RF signal, and the secondary amplifying group includes a first secondary amplifier, wherein the first secondary amplifier includes: a third amplifying unit disposed between the driving power terminal and the ground, the third amplifying unit secondarily and differentially amplifying the first balanced RF signal from the primary amplifier; and a fourth amplifying unit connected in series between the driving power terminal and the third amplifying unit, and complementarily switched on/off with the third amplifying unit, the fourth amplifying unit secondarily and differentially amplifying the second balanced RF signal from the primary amplifier.

The primary amplifier may include: first to fourth input capacitors connected in series between signal input terminals of the first and second amplifying units and output terminals of the balanced RF signal from the balun, respectively; and first to fourth resistors connected in series between the first to fourth input capacitors and output terminals of the first and second balanced RF signals, respectively, wherein the first to fourth capacitors eliminate a direct current component from the balanced RF signal from the balun, respectively, and the first to fourth resistors separate the balanced RF signal terminals and the output terminals of the first and second balanced RF signals from each other, and supply a bias power to the first and second amplifying units, respectively.

The first secondary amplifier may include: a plurality of bias voltages connected in series between the driving power terminal and an input terminal of the first balanced RF signal, and between the ground and an input terminal of the second balanced RF signal, respectively, the bias voltages supplying a bias power to the third and fourth amplifying units, respectively; a plurality of first separation resistance groups connected in series between the input terminals of the first and second balanced RF signals and the output terminals of the secondarily amplified RF signal, respectively, the first separation resistance groups separating input and output signals from each other; and a plurality of second separation resistance groups connected in series between corresponding ones of the output terminals of the secondarily amplified RF signal having different polarities from each other to separate each output signal.

The first amplifying unit may include a plurality of amplifying elements, the plurality of amplifying elements including at least two groups of amplifying elements where at least two of the amplifying elements are connected in series to each other, the two groups of amplifying elements connected in parallel to each other to differentially amplify the balanced RF signal, the second amplifying unit includes a plurality of amplifying elements, the plurality of amplifying elements of the second amplifying unit including at least two groups of amplifying elements where at least two of the amplifying elements of the second amplifying unit are connected in series to each other, the two groups of amplifying elements of the second amplifying unit are connected in parallel to each other to be complementarily switched on/off with the two groups of amplifying elements of the first amplifying unit, each of the respective two groups of amplifying elements of the first and second amplifying units includes a P-channel field effect transistor and an N-channel field effect transistor, wherein the P-channel field effect transistor has a gate receiving the balanced RF signal, a source receiving a power source and a drain outputting an amplified signal, and the N-channel field effect transistor has a gate receiving the balanced RF signal, a source receiving a power source and a drain outputting an amplified signal and connected to the drain of the P-channel field effect transistor.

The N-channel field effect transistors of the first amplifying unit may have respective source terminals connected together and the P-channel field effect transistors of the second amplifying unit may have respective source terminals connected to the respective source terminals of the N-channel field effect transistors of the first amplifying unit to thereby form a virtual ground.

The third amplifying unit of the secondary amplifier may include a plurality of cascode amplifying elements connected in parallel to one another to differentially amplify the first balanced RF signal, and the fourth amplifying unit connected in series between the driving power terminal and the third amplifying unit, the fourth amplifying unit including a plurality of cascode amplifying elements complementarily switched on/off with the plurality of cascode amplifying elements of the third amplifying unit, the plurality of cascode amplifying elements of the fourth amplifying unit connected in parallel to one another to differentially amplify the second balanced RF signal.

The third amplifying unit of the first secondary amplifier may include first and second cascode amplifying elements connected in parallel to each other, wherein the first cascode amplifying element includes a first field effect transistor having a gate receiving the first balanced RF signal, a source connected to the ground and a drain outputting an amplified signal, and a second field effect transistor having a source connected to the drain of the first field effect transistor, a drain outputting an amplified signal and a gate, and the second cascode amplifying element includes a third field effect transistor having a gate receiving the first balanced RF signal, a source connected to the ground and a drain outputting an amplified signal, and a fourth field effect transistor having a source connected to the drain of the third field effect transistor, a drain outputting an amplified signal and a gate, the fourth amplifying unit of the first secondary amplifier includes third and fourth cascode amplifying elements, wherein the third cascode amplifying element includes a fifth field effect transistor having a source receiving the driving power, a gate receiving the second balanced RF signal and a drain, and a sixth field effect transistor having a source connected to the drain of the fifth field effect transistor, a drain outputting an amplified signal and a source, and the fourth cascode amplifying element includes a seventh field effect transistor having a source receiving the driving power, a gate receiving the second balanced RF signal, and a drain, and an eighth field effect transistor having a source connected to the drain of the seventh field effect transistor, a drain outputting an amplified signal, and a source.

The second and fourth field effect transistors may have the respective gates connected together and the sixth and eighth field effect transistors may have the respective gates connected to the respective gates of the second and fourth field effect transistors together to thereby form a virtual ground.

The secondary amplifying group may further include: second and third secondary amplifiers each connected in parallel to the first secondary amplifier and secondarily amplifying the first and second balanced RF signals, respectively; and wherein the second secondary amplifier includes a fifth amplifying unit disposed between the driving power terminal and the ground and having a plurality of cascode amplifying elements connected in parallel to one another to differentially amplify the first balanced RF signal; and a sixth amplifying unit connected in series between the driving power terminal and the fifth amplifying unit and having a plurality of cascode amplifying elements complementarily switched on/off with the plurality of cascode amplifying elements of the fifth amplifying unit to differentially amplify the second balanced RF signal; and the third secondary amplifier includes a seventh amplifying unit disposed between the driving power terminal and the ground and having a plurality of cascode amplifying elements connected in parallel to one another to differentially amplify the first balanced RF signal, and an eighth amplifying unit connected in series between the driving power terminal and the seventh amplifying unit and having a plurality of cascode amplifying elements complementarily switched on/off with the plurality of cascode amplifying elements of the seventh amplifying unit to differentially amplify the second amplified balanced RF signal.

In respective output terminals of the first to third secondary amplifiers, corresponding ones of the output terminals outputting the balanced RF signal having phases identical to each other may be commonly connected.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
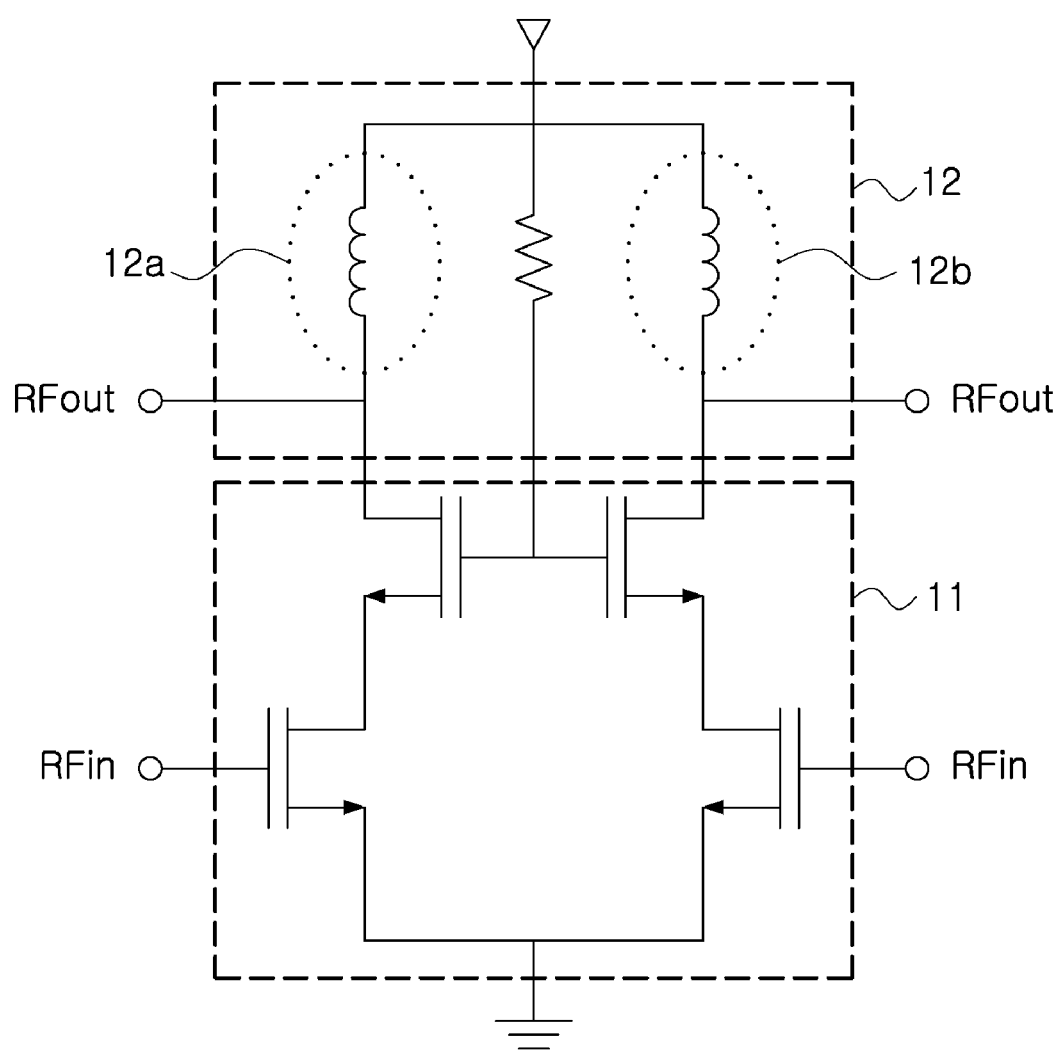
FIG. 1 is a circuit diagram illustrating a conventional amplifying device.
Figure 2:
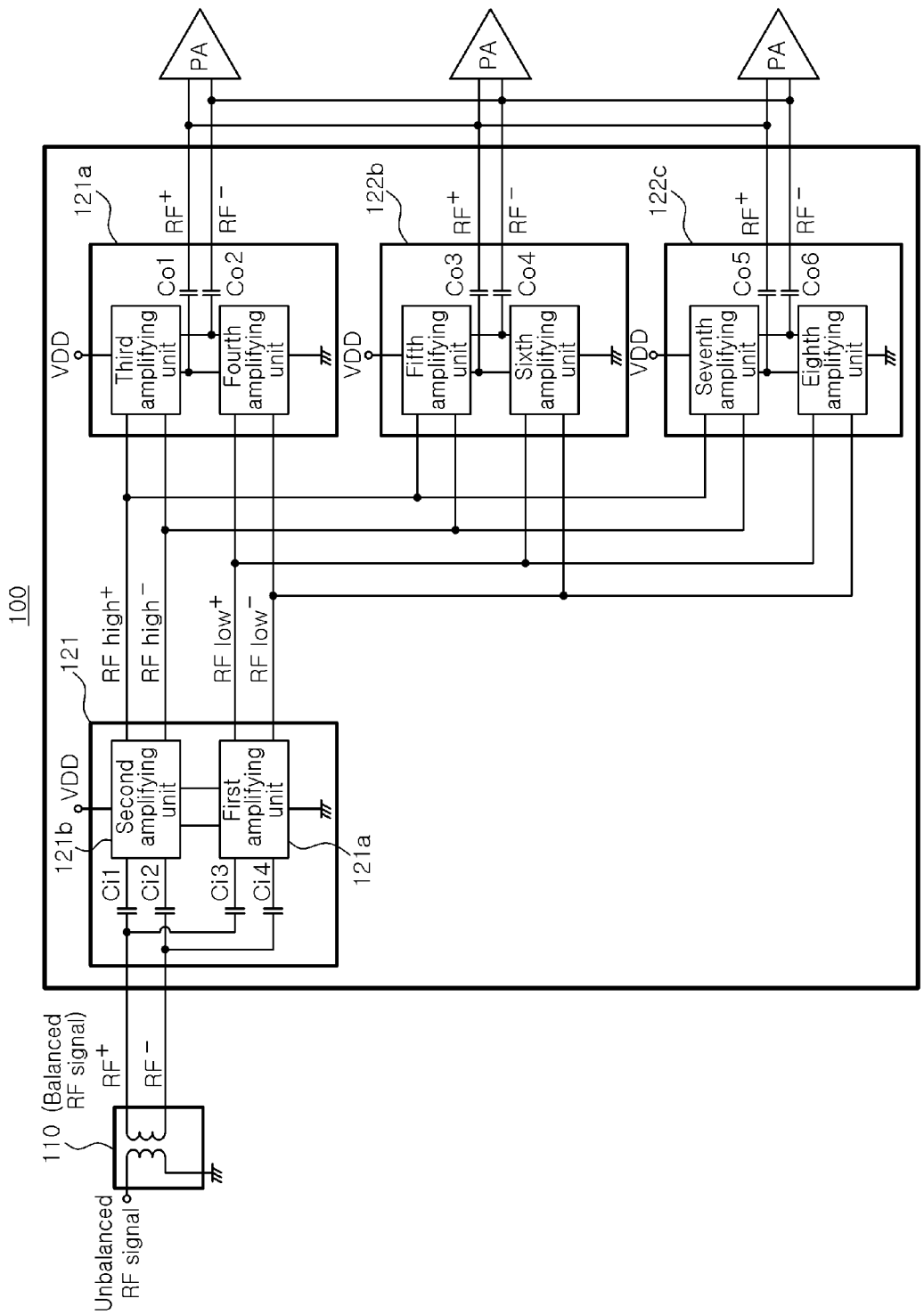
FIG. 2 is a schematic structural view illustrating an amplifying device according to an exemplary embodiment of the invention.

FIG. 2 is a schematic structural view illustrating an amplifying device according to an exemplary embodiment of the invention.

Referring to FIG. 2, the amplifying device 100 of the present embodiment includes a balun 110 and an amplifying part 120.

The balun 110 receives an unbalanced radio frequency (RF) signal and outputs a balanced RF signal having phases opposite to each other.

The amplifying part 120 amplifies a voltage level of the balanced RF signal from the balun 110.

The amplifying part 120 may include a plurality of amplifiers to amplify a current of the balanced RF signal to a necessary level. Accordingly, the amplifying part 120 may include a primary amplifier 121 and a secondary amplifier group 122.

The primary amplifier 121 may include first and second amplifying units 121a and 121b. The first and second units 121a and 121b output first and second balanced radio frequency (RF) signals having voltage levels different from each other, respectively. The secondary amplifier group may include a plurality of secondary amplifiers secondarily amplifying the balanced RF signals primarily amplified by the primary amplifier 121.

The secondary amplifier group 122 may include first to third secondary amplifiers 122a, 122b, and 122c according to an exemplary embodiment of the invention. The first to third secondary amplifiers 122a, 122b, and 122c each may include two amplifying units connected to each other between a driving power terminal and a ground.

The secondarily amplified balanced RF signal from the secondary amplifier group 122 may be utilized as a driving signal for driving a power amplifier (PA) employed in a global system for mobile communications (GSM) or a general packet radio service (GPRS).

The primary amplifier 121 and the secondary amplifier group 122 will be described in detail with reference to FIGS. 3A and 3B.

Figure 3A:
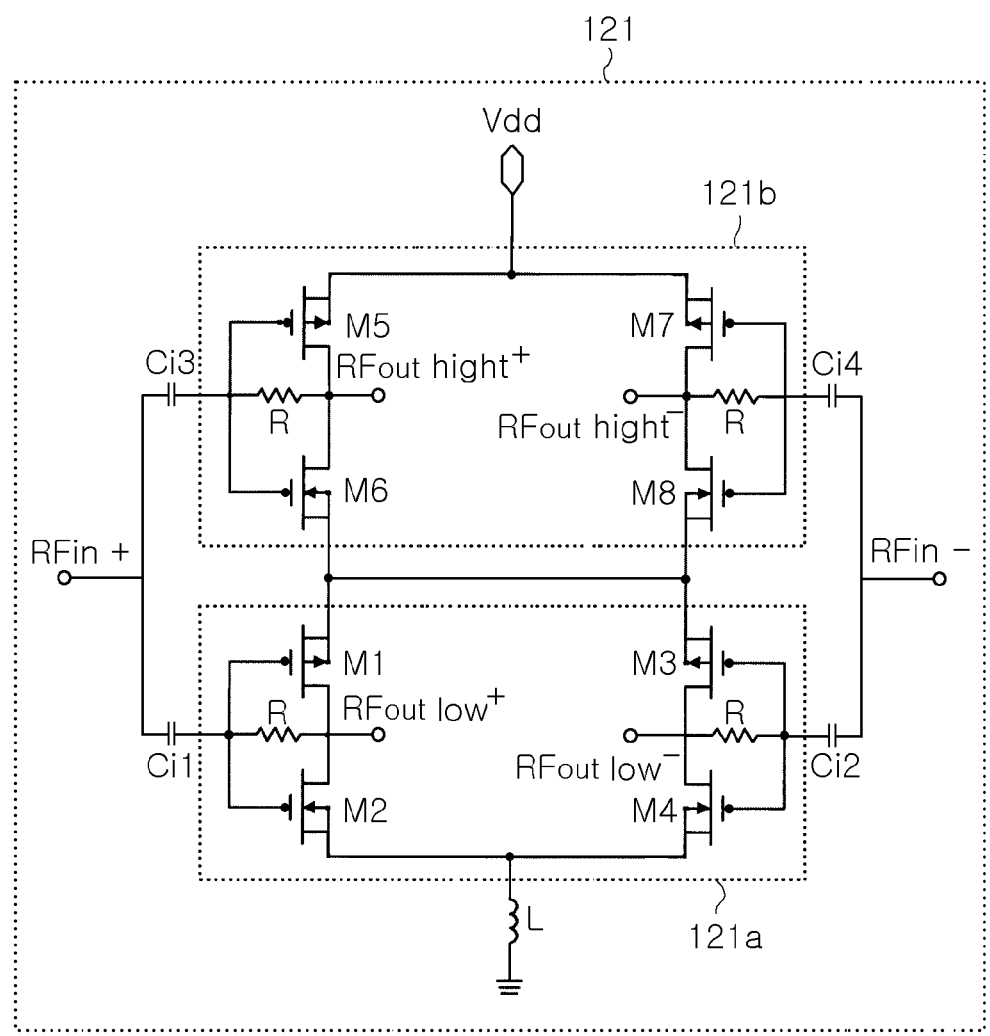
FIGS. 3A and 3B are circuit diagrams illustrating a primary amplifier and a secondary amplifier applied to an amplifying device, respectively according to an exemplary embodiment of the invention.
Figure 3B:
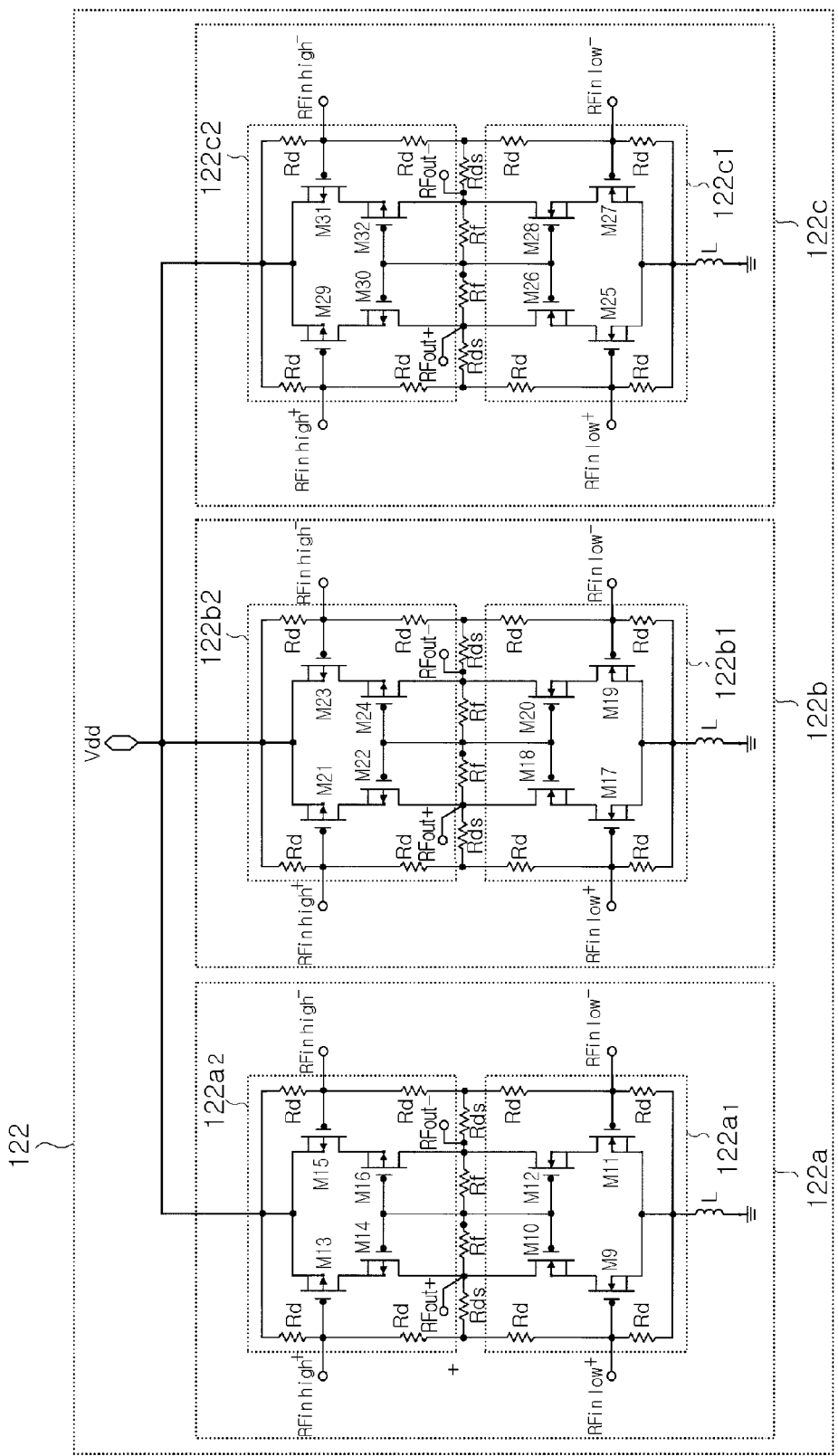

FIGS. 3A and 3B are circuit diagrams illustrating the primary and secondary amplifiers applied to the amplifying device of the present embodiment.

Referring to FIG. 3A, the primary amplifier 121 employed in the amplifying device of the present embodiment may include a first amplifying unit 121a disposed between a driving power terminal Vdd and a ground, and a second amplifying unit 121b connected in series to the first amplifying unit 121a between the driving power terminal Vdd and the first amplifying unit 121a.

The first amplifying unit 121a may be formed of first to fourth field effect transistors (FET)s. Here, the first FET M1 has a drain connected in series to a drain of the second FET M2, and the third FET M3 has a drain connected in series to a drain of the fourth FET M4. Moreover, each of the first to fourth FETs M1, M2, M3, and M4 has a balanced radio frequency (RF) signal from the balun 110. Here, out of the balanced RF signal, a positive (+) balanced RF signal component may be inputted to the gates of the first and second FETs M1 and M2, respectively. On the contrary, a negative (−) balanced RF signal component having a phase difference of 180° from the positive (+) balanced RF signal component may be inputted to the gates of the third and fourth FETs M3 and M4, respectively. The first and second FETs M1 and M2 are connected in parallel with the third and fourth FETs M3 and M4 to thereby form the first amplifying unit 121a.

Likewise, the second amplifying unit 121b may be formed of fifth to eighth FETS M5, M6, M7 and M8. Here, the fifth FET M5 has a drain connected in series to a drain of the sixth FET M6, and the seventh FET M7 has a drain connected in series to a drain of the eighth FET M8. Moreover, each of the fifth to eighth FETs M5, M6, M7, and M8 has a gate receiving a balanced RF signal from the balun 110. A positive (+) balanced RF signal component may be inputted to the gates of the fifth and sixth FETs M5 and M6, respectively. Meanwhile, a negative (−) balanced RF signal may be inputted to the gates of the seventh and eighth FETs M7 and M8, respectively. The fifth and sixth FETs M5 and M6 are connected in parallel to the seventh and eighth FETs MI3 and MI4 to thereby form the second amplifying unit 121b.

Out of the first to eighth FETS, the first, third, fifth and seventh FETs M1, M3, M5, and M7 may be configured as a P-channel FET. On the contrary, the second, fourth, sixth and eighth FETs M2, M4, M6 and M8 may be configured as an N-channel FET.

Also, signals are separated through resistors R connected to input terminals of the balanced RF signal and output terminals of the first and second balanced RF signals RF out high+, RF out high−, RF out low+, and RF out low−, respectively and a bias power of each of the FETs is supplied. Also, corresponding ones of the first to fourth input capacitors Ci1, Ci2, Ci3, and Ci4 are connected to the input terminals of the balanced RF signal, respectively to inhibit transfer of a DC component of the balanced RF signal.

The primary amplifier 121 has the first amplifying unit 121a and the second amplifying unit 121b connected in series to each other between the driving power terminal Vdd and the ground to have the driving power Vdd distributed thereto. Therefore, even though a high driving power Vdd of e.g., 3.4V is applied, each of the FETs can have an allowable voltage of 0.75V applied thereto so as to be stably operable.

Accordingly, the first and second balanced RF signals RF out high+, RF out high−, RF out low+, and RF out low− outputted from the first and second amplifying units 121a and 121b of the primary amplifier 121, respectively have a voltage level different from each other. As described, when a driving voltage of 3.4V is applied, the each of the FETs may have a voltage drop of about 0.75V. Given this, the second balanced RF signal RF out high+ and RF out high− has a voltage level of about 2.48V and the first balanced RF signal RF out low+ and RF out low− has a voltage level of about 0.78V.

Referring to FIG. 3B, the secondary amplifier group 122 employed in the amplifying device of the present embodiment may include first to third secondary amplifiers 122a, 122b, and 122c. When it comes to a structure of the first secondary amplifier, the first secondary amplifier 122a includes a third amplifying unit 122a1 disposed between the driving power terminal Vdd and the ground and a fourth amplifying unit 122a2 disposed between the driving power terminal Vdd and the third amplifying unit 122a1 and connected in series to the third amplifying unit 122a1.

The third amplifying unit 122a1 includes ninth to twelfth FETs M9, M10, M11, and M12. The ninth FET M9 has a drain connected in series to a source of the tenth FET M10 to form a first cascode amplifying element. Also, the eleventh FET M11 has a drain connected in series to a source of the twelfth FET M12 to form a second cascode amplifying element. The first cascode amplifying element and the second cascode amplifying element are connected in parallel to each other to form a third amplifying unit 122a1.

Likewise, the fourth amplifying unit 122a2 includes thirteenth to sixteenth FETs M13, M14, M15, and M16. The thirteenth FET M13 has a drain connected in series to a source of the fourteenth FET M14 to form a third cascode amplifying element. Also, the fifteenth FET M15 has a drain connected in series to a source of the sixteenth FET M16 to form a second cascode amplifying element. The third cascode amplifying element and the fourth cascode amplifying element are connected in parallel to each other to form a fourth amplifying unit 122a2.

The third amplifying unit 122a1 and the fourth amplifying unit 122a2 are connected in series to each other between the driving power terminal Vdd and the ground, and thus can operate easily when a high voltage of the driving power Vdd is supplied. The tenth FET M10 has a gate connected to a gate of the twelfth FET M12 and the fourteenth FET M14 has a gate connected to a gate of the sixteenth FET M16 to form a virtual ground, thereby ensuring the signal to be amplified stably.

Furthermore, the signals are separated through first separation voltages Rds connected to the input terminals of the first and second balanced RF signals RF out high+, RF out high−, RF out low+ and RF out low− and the output terminals of the secondarily-amplified balanced RF signal, respectively. The driving power Vdd is distributed by bias voltages Rd to supply necessary power source to each of the FETs. Also, a DC bias voltage is applied to the gates of the tenth FET M10, the twelfth FET M12, the fourteenth FET M14 and the sixteenth FET M16 by resistors Rf, respectively.

Moreover, the ninth to twelfth FETs may be configured as an N-channel FET and the thirteenth to sixteenth FETs may be configured as a P-channel FET. Out of the first and second balanced RF signals, positive (+) first and second balanced RF signals RF in high+ and RF in low+ may be inputted to the gates of the ninth and thirteenth FETs M9 and M13, respectively. Meanwhile, out of the first and second balanced RF signals, negative (−) first and second balanced RF signals RF in high− and RF in low− may be inputted to the eleventh and fifteenth FETs M11 and M15, respectively. In addition, out of the secondarily-amplified balanced RF signal, a secondarily-amplified positive (+) balanced RF signal component RF out+ may be outputted from a node where the tenth and fourteenth FETs M10 and M14 have respective drains connected together. Meanwhile, out of the secondarily-amplified balanced RF signal, a secondarily-amplified negative (−) balanced RF signal component RF out− may be outputted from a node where the twelfth and sixteenth FETs M12 and M16 have respective drains connected together to have a phase difference of 180° from the secondarily-amplified positive (+) balanced RF signal component RF out+.

The second and third secondary amplifiers are structured identically to the first secondary amplifier. In a brief description, the second secondary amplifier 122b includes a fifth amplifying unit 122b1 and a sixth amplifying unit 122b2. The fifth amplifying unit 122b1 includes seventeenth to twentieth FETs M17, M18, M19, and M20 structured identically to the ninth to twelfth FETs M9, M10, M11, and M12. The sixth amplifying unit 122b2 includes twenty first to twenty fourth FETs M21, MI22, MI23, and MI24 structured identically to the thirteenth to sixteenth 16 FETs M13, M14, M15, and M16.

Likewise, the third secondary amplifier 122c includes a seventh amplifying unit 122c1 and an eighth amplifying unit 122c2. The seventh amplifying unit includes twenty fifth to twenty eighth FETs M25, M26, M27, and M28 structured identically to the ninth to twelfth FETs M9, M10, M11, and M12. The eighth amplifying unit 122c2 includes twenty ninth to thirty second FETS M29, M30, M31, and M32 structured identically to the thirteenth to sixteenth FETs M13, M14, M15, and M16.

The first to third secondary amplifiers 22a, 122b, and 122c are connected in parallel to one another to secondarily amplify a voltage level of the balanced RF signal amplified from the primary amplifier 121. Here, corresponding ones of first to sixth output capacitors Co1, Co2, Co3, Co4, Co5, and Co6 are connected to the output terminals of the first to third secondary amplifiers 122a, 122b and 122c, respectively to block output of a DC component included in the secondarily-amplified balanced RF signal. Also, corresponding ones of the output terminals outputting the balanced RF signals having identical phases to each other are commonly connected.

This allows the balanced RF signals outputted from the output terminals to be balanced in phase to decrease occurrence of harmonic waves, thereby enhancing efficiency.

In addition, the primary amplifier 121 and the first to third secondary amplifiers 122a, 122b, and 122c are grounded through a current balanced inductor L.

Figure 4A:
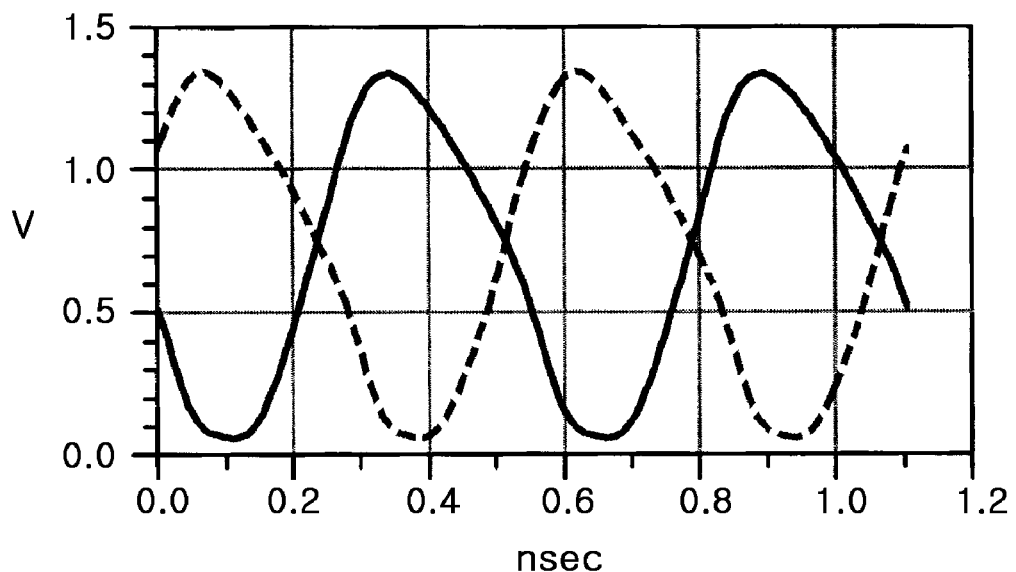
FIGS. 4A and 4B are graphs illustrating output signals of primary and secondary amplifiers applied to an amplifying device, respectively according to an exemplary embodiment of the invention.
Figure 4B:
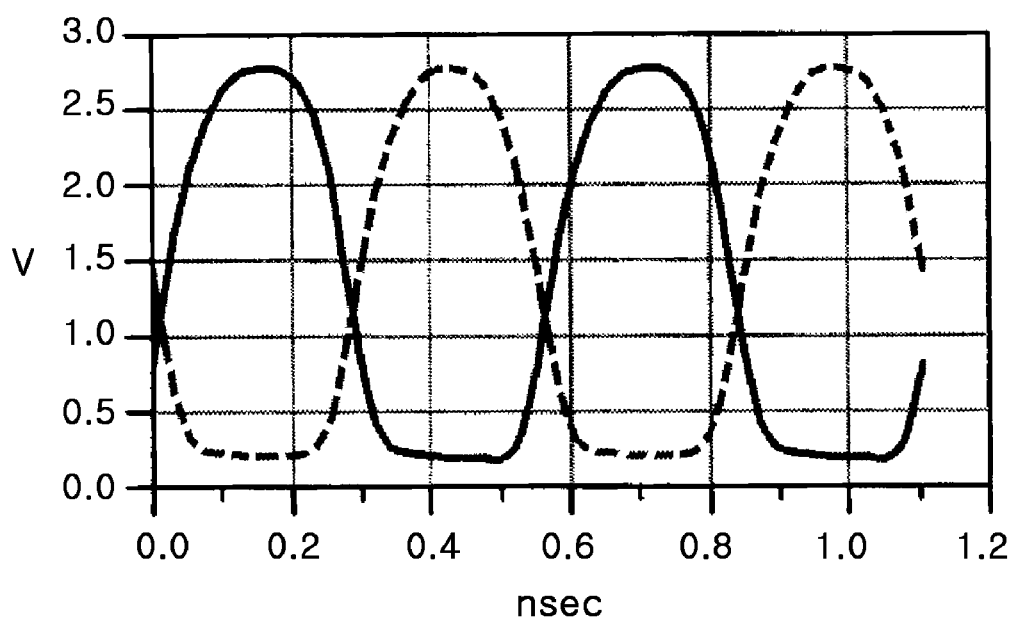

FIGS. 4A and 4B are graphs illustrating output signals of the primary amplifier and the second amplifier employed in the amplifier of the present embodiment.

FIG. 4A plots a balanced RF signal amplified by the primary amplifier employed in the amplifier according to the present embodiment. The balanced RF signal is amplified by about 10 dB from an input RF signal. Thus, a secondary amplifier is required to enable the RF signal to be amplified by 21 dB or more as the users generally require.

FIG. 4B plots a balanced RF signal secondarily amplified by a secondary amplifying group employed in the amplifying device according to the present embodiment. Here, the balanced RF signal amplified by the primary amplifier is secondarily amplified by 21 dB or more which is a level required by the users. The secondarily-amplified balanced RF signal has a squarer shape than the primarily-amplified balanced RF signal to reduce current consumption resulting from switching of the FETs.

The RF signal amplifying device of the present embodiment converts an unbalanced RF signal into a balanced RF signal and amplifies a voltage of the balanced RF signal to a usable level to act as a driving amplifier of an RF signal power amplifying apparatus which can be connected to a rear end thereof.

As set forth above, an RF signal amplifying device according to exemplary embodiments of the invention has a pair of cascode amplifiers and a pair of cascode inverting amplifiers connected in series to each other between a driving power and a ground, thus operating stably at a driving power having a high voltage of about 3.4 v. Also, the RF signal amplifying device can act as a driving amplifier supplying a necessary voltage to an RF signal power amplifying apparatus employed in a GSM/GPRS. Moreover, output terminals outputting a balanced RF signal having identical phases to each other are commonly connected to reduce harmonic waves and increase efficiency.

In addition, some of the amplifiers have gates virtually grounded to ensure signals to be amplified stably.

While the present invention has been shown and described in connection with the exemplary embodiments, it will be apparent to those skilled in the art that modifications and variations can be made without departing from the spirit and scope of the invention as defined by the appended claims.

What is claimed is:

1. A radio frequency signal amplifying device comprising:
a balun converting an unbalanced radio frequency signal into a balanced radio frequency signal;
a primary amplifier differentially amplifying the balanced radio frequency signal from the balun; and
a secondary amplifying group comprising at least one secondary amplifier secondarily and differentially amplifying the balanced radio frequency signal amplified from the primary amplifier,
wherein the primary amplifier comprises:
a first amplifying unit disposed between a driving power terminal supplying a predetermined driving power and a ground, the first amplifying unit differentially amplifying the balanced radio frequency signal and outputting a first balanced radio frequency signal having a predetermined voltage level;
a second amplifying unit connected in series between the driving power terminal and the first amplifying unit, and complementarily switched on/off with the first amplifying unit, the second amplifying unit differentially amplifying the balanced RF signal and outputting a second balanced radio frequency signal having a voltage level higher than the voltage level of the first balanced radio frequency signal, and
the secondary amplifying group comprises a first secondary amplifier,
wherein the first secondary amplifier comprises:
a third amplifying unit disposed between the driving power terminal and the ground, the third amplifying unit secondarily and differentially amplifying the first balanced radio frequency signal from the primary amplifier; and
a fourth amplifying unit connected in series between the driving power terminal and the third amplifying unit, and complementarily switched on/off with the third amplifying unit, the fourth amplifying unit secondarily and differentially amplifying the second balanced radio frequency signal from the primary amplifier.

2. The radio frequency signal amplifying device of claim 1, wherein the primary amplifier comprises:

first to fourth input capacitors connected in series between signal input terminals of the first and second amplifying units and output terminals of the balanced radio frequency signal from the balun, respectively; and first to fourth resistors connected in series between the first to fourth input capacitors and output terminals of the first and second balanced radio frequency signals, respectively, wherein the first to fourth capacitors eliminate a direct current component from the balanced radio frequency signal from the balun, respectively, and the first to fourth resistors separate the balanced radio frequency signal terminals and the output terminals of the first and second balanced radio frequency signals from each other, and supply a bias power to the first and second amplifying units, respectively.

3. The radio frequency signal amplifying device of claim 2, wherein the first secondary amplifier comprises:

a plurality of bias voltages connected in series between the driving power terminal and an input terminal of the first balanced radio frequency signal, and between the ground and an input terminal of the second balanced radio frequency signal, respectively, the bias voltages supplying a bias power to the third and fourth amplifying units, respectively;

a plurality of first separation resistance groups connected in series between the input terminals of the first and second balanced radio frequency signals and the output terminals of the secondarily amplified radio frequency signal, respectively, the first separation resistance groups separating input and output signals from each other; and a plurality of second separation resistance groups connected in series between corresponding ones of the output terminals of the secondarily amplified radio frequency signal having different polarities from each other to separate each output signal.

4. The radio frequency signal amplifying device of claim 2, wherein the first amplifying unit comprises a plurality of amplifying elements, the plurality of amplifying elements comprising at least two groups of amplifying elements where at least two of the amplifying elements are connected in series to each other, the two groups of amplifying elements connected in parallel to each other to differentially amplify the balanced radio frequency signal, the second amplifying unit comprises a plurality of amplifying elements, the plurality of amplifying elements of the second amplifying unit comprising at least two groups of amplifying elements where at least two of the amplifying elements of the second amplifying unit are connected in series to each other, the two groups of amplifying elements of the second amplifying unit are connected in parallel to each other to be complementarily switched on/off with the two groups of amplifying elements of the first amplifying unit, each of the respective two groups of amplifying elements of the first and second amplifying units comprises a P-channel field effect transistor and an N-channel field effect transistor, wherein the P-channel field effect transistor has a gate receiving the balanced radio frequency signal, a source receiving a power source and a drain outputting an amplified signal, and the N-channel field effect transistor has a gate receiving the balanced radio frequency signal, a source receiving a power source and a drain outputting an amplified signal and connected to the drain of the P-channel field effect transistor.

5. The radio frequency signal amplifying device of claim 4, wherein the N-channel field effect transistors of the first amplifying unit have respective source terminals connected together and the P-channel field effect transistors of the second amplifying unit have respective source terminals connected to the respective source terminals of the N-channel field effect transistors of the first amplifying unit to thereby form a virtual ground.

6. The radio frequency signal amplifying device of claim 3, wherein the third amplifying unit of the secondary amplifier comprises a plurality of cascode amplifying elements connected in parallel to one another to differentially amplify the first balanced radio frequency signal, and the fourth amplifying unit connected in series between the driving power terminal and the third amplifying unit, the fourth amplifying unit comprising a plurality of cascode amplifying elements complementarily switched on/off with the plurality of cascode amplifying elements of the third amplifying unit, the plurality of cascode amplifying elements of the fourth amplifying unit connected in parallel to one another to differentially amplify the second balanced radio frequency signal.

7. The radio frequency signal amplifying device of claim 6, wherein the third amplifying unit of the first secondary amplifier comprises first and second cascode amplifying elements connected in parallel to each other, wherein the first cascode amplifying element comprises a first field effect transistor having a gate receiving the first balanced radio frequency signal, a source connected to the ground and a drain outputting an amplified signal, and a second field effect transistor having a source connected to the drain of the first field effect transistor, a drain outputting an amplified signal and a gate, and the second cascode amplifying element comprises a third field effect transistor having a gate receiving the first balanced radio frequency signal, a source connected to the ground and a drain outputting an amplified signal, and a fourth field effect transistor having a source connected to the drain of the third field effect transistor, a drain outputting an amplified signal and a gate, the fourth amplifying unit of the first secondary amplifier comprises third and fourth cascode amplifying elements, wherein the third cascode amplifying element comprises a fifth field effect transistor having a source receiving the driving power, a gate receiving the second balanced radio frequency signal and a drain, and a sixth field effect transistor having a source connected to the drain of the fifth field effect transistor, a drain outputting an amplified signal and a source, and the fourth cascode amplifying element comprises a seventh field effect transistor having a source receiving the driving power, a gate receiving the second balanced radio frequency signal, and a drain, and an eighth field effect transistor having a source connected to the drain of the seventh field effect transistor, a drain outputting an amplified signal, and a source.

8. The radio frequency signal amplifying device of claim 7, wherein the second and fourth field effect transistors have the respective gates connected together and the sixth and eighth field effect transistors have the respective gates connected to the respective gates of the second and fourth field effect transistors together to thereby form a virtual ground.

9. The radio frequency signal amplifying device of claim 6, wherein the secondary amplifying group further comprises: second and third secondary amplifiers each connected in parallel to the first secondary amplifier and secondarily amplifying the first and second balanced radio frequency signals, respectively; and wherein the second secondary amplifier comprises a fifth amplifying unit disposed between the driving power terminal and the ground and having a plurality of cascode amplifying elements connected in parallel to one another to differentially amplify the first balanced radio frequency signal; and a sixth amplifying unit connected in series between the driving power terminal and the fifth amplifying unit and having a plurality of cascode amplifying elements complementarily switched on/off with the plurality of cascode amplifying elements of the fifth amplifying unit to differentially amplify the second balanced radio frequency signal; and the third secondary amplifier comprises a seventh amplifying unit disposed between the driving power terminal and the ground and having a plurality of cascode amplifying elements connected in parallel to one another to differentially amplify the first balanced radio frequency signal, and an eighth amplifying unit connected in series between the driving power terminal and the seventh amplifying unit and having a plurality of cascode amplifying elements complementarily switched on/off with the plurality of cascode amplifying elements of the seventh amplifying unit to differentially amplify the second amplified balanced radio frequency signal.

10. The radio frequency signal amplifying device of claim of claim 8, wherein in respective output terminals of the first to third secondary amplifiers, corresponding ones of the output terminals outputting the balanced radio frequency signal having phases identical to each other are commonly connected.

\* \* \* \* \*